(12) United States Patent
Zou et al.

(10) Patent No.: US 10,812,095 B2
(45) Date of Patent: Oct. 20, 2020

(54) DEEP LEARNING BASED METHOD AND DEVICE FOR NOISE SUPPRESSION AND DISTORTION CORRECTION OF ANALOG-TO-DIGITAL CONVERTERS

(71) Applicant: Shanghai Jiao Tong University, Shanghai (CN)

(72) Inventors: Weiwen Zou, Shanghai (CN); Shaofu Xu, Shanghai (CN); Jianping Chen, Shanghai (CN)

(73) Assignee: Shanghai Jiao Tong University, Shanghai (CN)

( * ) Notice: Subject to any disclaimer, the term of this patent is extended or adjusted under 35 U.S.C. 154(b) by 182 days.

(21) Appl. No.: 16/132,202

(22) Filed: Sep. 14, 2018

(65) Prior Publication Data

US 2019/0319633 A1    Oct. 17, 2019

(30) Foreign Application Priority Data

Apr. 14, 2018  (CN) .......................... 2018 1 0334063

(51) Int. Cl.
  *H03M 1/06*    (2006.01)
  *H03M 1/10*    (2006.01)
  (Continued)

(52) U.S. Cl.
  CPC ........ *H03M 1/1033* (2013.01); *G06K 9/6256* (2013.01); *G06N 3/08* (2013.01); *H03M 1/08* (2013.01); *H03M 1/12* (2013.01)

(58) Field of Classification Search
  CPC ........ H03M 1/1033; H03M 1/08; H03M 1/12; H03M 1/1038; H03M 1/1215;
  (Continued)

(56) References Cited

U.S. PATENT DOCUMENTS 5,519,396 A * 5/1996 Distinti .................. G06N 3/063
  341/153
6,108,529 A * 8/2000 Vice ......................... H03D 7/14
  327/113

(Continued)

OTHER PUBLICATIONS

U.S. Appl. No. 16/132,103, filed Sep. 14, 2018, Shanghai Jiao Tong University.

(Continued)

*Primary Examiner* — Jean B Jeanglaude
(74) *Attorney, Agent, or Firm* — Mei & Mark LLP; Manni Li

(57) ABSTRACT

A device for noise suppression and distortion correction of analog-to-digital converters based on deep learning that realizes effect of correcting noise and distortion of analog to digital converters. The method is applied to electronic ADCs or photonic ADCs. It utilizes the learning ability of the deep network to perform system response learning on ADCs which need noise suppression and distortion correction, establishes a computational model in the deep network that can suppress the reconstruction of noises and distorted signals, performs noise suppression and distortion correction on the signals obtained by ADCs, and thereby improves performance of the learned ADCs. The device improves the performance of the microwave photon system with high sampling precision of microwave photon radar and optical communication system.

5 Claims, 5 Drawing Sheets

(51) Int. Cl.
*G06K 9/62* (2006.01)
*G06N 3/08* (2006.01)
*H03M 1/08* (2006.01)
*H03M 1/12* (2006.01)

(58) Field of Classification Search
CPC ...... H03M 1/1009; H03M 1/124; H03M 1/06; H03M 1/1023; G06K 9/6256; G06K 9/6273; G06K 9/0051; G06N 3/08; G06N 3/0481; G06N 3/0454
USPC .................................................. 341/118, 155
See application file for complete search history.

(56) References Cited

U.S. PATENT DOCUMENTS

| | | | | |
|---|---|---|---|---|
| 6,160,506 | A * | 12/2000 | Pellon | H03M 3/39 341/143 |
| 6,392,596 | B1 * | 5/2002 | Lin | G01S 19/21 342/372 |
| 7,826,752 | B1 * | 11/2010 | Zanoni | H04B 10/5055 398/186 |
| 9,843,398 | B1 * | 12/2017 | Zanoni | H04B 1/0007 |
| 9,935,647 | B2 * | 4/2018 | Chang | H03M 1/122 |
| 10,333,691 | B2 * | 6/2019 | Han | H04B 1/0007 |
| 2003/0091116 | A1 * | 5/2003 | Yap | H03M 3/47 375/247 |
| 2003/0128143 | A1 * | 7/2003 | Yap | H03M 3/496 341/143 |
| 2009/0267746 | A1 * | 10/2009 | Muchkaev | H04Q 9/00 340/10.4 |
| 2011/0234435 | A1 * | 9/2011 | Woodward | H03M 1/124 341/137 |
| 2012/0058739 | A1 * | 3/2012 | McKinzie, III | H03H 7/40 455/248.1 |
| 2012/0213531 | A1 * | 8/2012 | Nazarathy | H03M 3/434 398/202 |
| 2013/0114073 | A1 * | 5/2013 | Namba | G01J 1/10 356/226 |
| 2017/0063389 | A1 * | 3/2017 | Chang | H03F 3/211 |
| 2018/0006730 | A1 * | 1/2018 | Kuo | H04B 10/616 |

OTHER PUBLICATIONS

George C. Valley, "Photonic analog-to-digital converters," Optics Express, vol. 15, No. 5, pp. 1955-1982 (Mar. 5, 2007).

G. Yang et al., "Compensation of multi-channel mismatches in high-speed high-resolution photonic analog-to-digital converter," Optics Express, vol. 24, No. 21, pp. 24061-24074 (Oct. 17, 2016).

Yann LeCun et al., "Deep learning," Nature, vol. 521, pp. 436-444 (May 28, 2015).

David Silver et al., "Mastering the game of Go with deep neural networks and tree search," Nature, vol. 529, pp. 484-503 (Jan. 28, 2016).

Junyuan Xie et al., "Image denoising and inpainting with deep neural networks," International Conference on Neural Information Processing Systems, pp. 341-349 (2012).

\* cited by examiner

DEEP LEARNING BASED METHOD AND DEVICE FOR NOISE SUPPRESSION AND DISTORTION CORRECTION OF ANALOG-TO-DIGITAL CONVERTERS

CROSS-REFERENCE TO RELATED APPLICATION

The subject application claims priority on Chinese application no. 201810334063.9 filed on Apr. 14, 2018. The contents and subject matter of the Chinese priority application is incorporated herein by reference.

FIELD OF TECHNOLOGY

The present invention relates to optical information processing technology, particularly, a deep learning based method and device for noise suppression and distortion correction of analog-to-digital converters.

BACKGROUND ART

An analog-to-digital converter (ADC) is a tool that converts continuous signals in the nature (i.e., an analog signal) into digital signals that are convenient for computer processing, transmission, and storage. An ADC is a bridge between the analog world and digital signal processing. In the field of the wideband digital radar and high-speed communications, the requirements on the ADC have increased. Taking a wideband digital radar as an example, the radar range resolution is inversely proportional to the bandwidth of the transmitted signal. To obtain higher range resolution, a radar often uses transmitted signals with ultra large bandwidth. The reception of these signals requires analog-to-digital conversion by the ADC whose sampling rate is twice its bandwidth, which means that the ADC requires high sampling rates in fields such as wideband digital radar and high-speed communications, and requires high-resolution quantization. Over the years, extensive researches have been conducted at home and abroad to improve the sampling rate of the ADC. The ADC technology, whether based on electronics or assisted by photonics (George Valley, "Photonic analog-to-digital converter," Optics Express, Vol. 15, No. 5, pp. 1955-1982, 2007), in terms of increasing sampling rate, multi-channel architecture design is adopted. Using multiple identical channels can multiply the sampling rate of the ADC. However, in a multi-channel architecture, channel amplitude and time mismatch effect will largely lead to sampled signal distortion. Besides, factors that contribute to distortion include the nonlinearity of the amplifier, comparator fuzz, the nonlinearity of electro-optic sampling gate, and timing jitter. Although in the hardware design and realization, researchers have carefully arranged and adjusted relevant parameters to minimize the distortion caused by the ADC conversion process, it is still difficult to achieve ideal analog-to-digital conversion of the original signal. At present, the highest sampling rate of commercial chips in the world is about 30 Gs/s and 5.5 bit, and the corresponding device can process an analog bandwidth up to 30 GHz. According to the international research report, the highest sampling rate of optical analog-to-digital converters is 40 GS/s and ~7 bit. See, G. Yang et al., "Compensation of multi-channel mismatches in high-speed high-resolution photonic analog-to-digital converter," Opt. Express, Vol. 24, pp. 24074.

In recent years, deep learning technology has attracted great attention from the scientific community. It is a signal processing technology that adopts the computational structure of biology-like neural networks, uses a large amount of known information to optimize training of the computing network and finally realizes correct decision for unknown inputs. See Yann LeCun et al., "Deep learning," Nature, Vol. 521, pp. 436-444, 2015. At the present, deep learning technology has achieved the ability that approaches and even surpasses human level in fields of computer vision, natural language processing, and human games (such as chess and go). See David Silver et al., "Mastering the game of Go with deep neural networks and tree search," Nature, Vol. 529, pp. 484-489, 2016. In terms of signal reconstruction, especially noise removal, deep learning technology is widely used in the fields of image denoising, image text removal, and image demosaicing because of the adaptability to noise, accuracy of de-noising results, and the advantage of large sample applicability. See Junyuan Xie et al., "Image denoising and inpainting with deep neural network," on *International Conference on Neural Information Processing Systems*, pp. 341-349, 2012. Applying deep learning techniques to ADCs not only solves noise and distortion problems introduced in electronic ADCs due to clock jitter, multi-channelization, and nonlinear amplification circuits, but also performs distortion correction for the nonlinear response of the photon sampling gate in PADC systems. It is of great significance for improving the performance of ADCs.

SUMMARY OF THE INVENTION

Aiming at the defect of the current technology, the present invention provides a deep learning based method and device for noise suppression and distortion correction of analog-to-digital converters. The method of the present invention is applied to electronic or photonic ADCs. The method of the present invention utilizes the learning ability of the deep networks to perform system response learning on ADCs which need noise suppression and distortion correction, establishes a computational model in the deep network that can suppress the reconstruction of noises and distorted signals, performs noise suppression and distortion correction on the signals obtained by ADCs, and thereby improves the performance of the learned ADCs.

The technical solution of present invention is as follows:

The deep learning based device of the present invention for noise suppression and distortion correction of analog-to-digital converters comprises an ADC and a deep learning information processing module. The deep learning information processing module comprises a microwave signal source, a digital signal processor, and a deep network. The first output port of the microwave signal source is connected to the input port of the ADC. The second output port of the microwave signal source is connected to the input port of the digital signal processor. The output port of the ADC is connected to the first input port of the deep network. The first output port of the digital signal processor is connected to the second input port of the deep network.

The ADC is an electronic ADC or a photonic ADC. The electronic ADC may be a data acquisition board or an oscilloscope.

The microwave signal source is a phase locked frequency-multiplied source, a voltage controlled oscillator, or an electro-optical oscillation source.

The digital signal processor is a field programmable gate array (FPGA) or a digital signal processor (DSP).

The deep network is a convolution neural network or a recurrent neural network, which can be constructed in a central processing unit (CPU), a graphic processing unit (GPU), a tensor processing unit (TPU), or a photonic neural network.

The method for noise suppression and distortion correction of analog-to-digital converters employing the device for noise suppression and distortion correction of analog-to-digital converters based on deep learning includes following steps:

(1) Training Phase:

A series of standard sinusoidal signals with known frequency and amplitude provided by the microwave signal source are respectively input into the ADC and the digital signal processor. The ADC converts the standard sinusoidal signals into digital signals with noise and distortion and input them into the deep network. The digital signal processor generates standard digital signals without noise and distortion according to the frequency and amplitude information of the standard sinusoidal signals and input them into the deep network. The deep network uses digital signals and standard digital signals without noise and distortion to train the parameters of the deep network. The training process applies optimization algorithm. After tens of thousands of iterative calculation of training, parameters of noise suppression and distortion correction are formed in the deep network, which minimizes the difference between digital signals with noise and distortion and standard digital signals. As a result, digital signals without noise and distortion can be output after parameter handling of the deep network.

(2) Application Phase:

Analog signals to be sampled are input through the input port of the ADC. The ADC inputs the converted digital signals with noise and distortion into the deep network. In the deep network, digital signals with noise and distortion is processed by parameters of noise suppression and distortion correction, then digital signals after process of noise suppression and distortion correction are output.

Based on the above technical features, the present invention is advantageous in that:

1. The present invention uses the deep network to learn the noise characteristics and distortion response of ADCs. It can recover digital signals through noise suppression and distortion correction and thereby improves the accuracy of the original ADCs.

2. The deep network performs real-time processing on sampled digital signals and achieves higher performance without introducing more system complexity.

The present invention has a very important role in improving the performance of the microwave photon system with high sampling precision of microwave photon radar and optical communication system.

DETAILED DESCRIPTIONS OF THE INVENTION AND EMBODIMENTS

In combination with Figures and the following embodiments, the present invention are further expounded. The embodiments implemented based on the technical solution of the present invention provide detailed implementations and procedures, and are not meant to limit the scope of the present invention.

Figure 1:
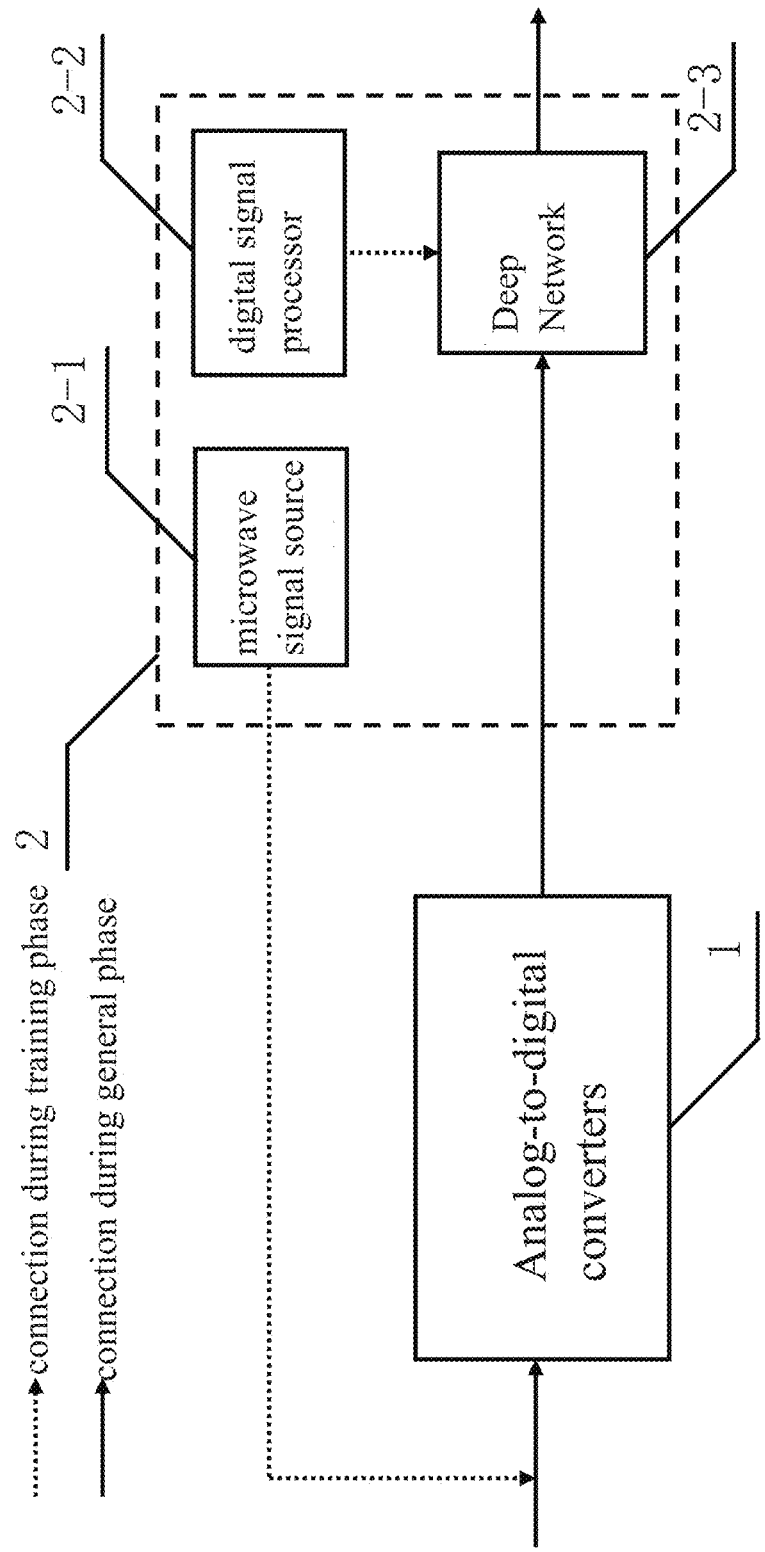
FIG. 1 is a schematic diagram showing one embodiment of the device for noise suppression and distortion correction of analog-to-digital converters based on deep learning of the present invention.

FIG. 1 is a schematic diagram of an embodiment of the device for noise suppression and distortion correction of ADCs based on deep learning in the present invention. As shown in FIG. 1, the device of the present invention comprises an ADC 1 and a deep learning information processing module 2. The construction process is divided into two phases: the training phase and the application phase. (The solid line in FIG. 1 denotes a general phase where they are always linked, including during the training phase and application phase; thus, at the application phase, the dashed lines are disconnected but the solid lines still connect.) The ADC 1 samples, quantizes, and then transforms the input sampled analog signals into digital signals. The digital signals do not completely recover the sampled signals, but rather have noise interference and signal distortion of the ADC.

In the embodiment, the single-channel photonic ADC device employed uses a photon sampling gate which introduces a large degree of nonlinear distortion. The deep learning information processing module 2 has multiple functional components, wherein the microwave signal source 2-1 provides standard sinusoidal signals with known frequency and amplitude, and the digital signal processor 2-2 generates standard digital signals according to the frequency and amplitude information of the known standard sinusoidal signals and input them into the deep network 2-3 as samples of training.

In the embodiment, the digital signal processor (DSP) 2-2 performs by a personal computer, wherein the deep network 2-3 performs calculations on input digital signals to obtain corresponding digital signals. The deep network 2-3 has a training function, that is, by comparing the output of the network with the standard result in the training sample, parameters of the network are reset according to optimization algorithm to minimize the difference between the output signal and the standard signal. A computational model that can suppress the reconstruction of noises and distorted signals is established in the deep network 2-3 through the process, and thereby performs noise suppression and distortion correction on signals obtained by the ADC 1. In the embodiment, the deep network 2-3 uses a four-layer convolution neural network of rectified linear unit and is implemented in the architecture of a computer with dual GPU.

Connections and functions of modules in the two phases of the construction process are described as follows:

(1) Training Phase:

The first output port of the microwave signal source 2-1 is connected to the first input port of the ADC 1. The first output port of the ADC 1 is connected to the first input port of the deep network 2-3. The first output port of the digital signal processor 2-2 is connected to the second input port of the deep network 2-3. The microwave signal source 2-1 provides a series of standard sinusoidal signals with known frequency and amplitude. In the embodiment, the signal used is divided into 24 equal parts according to frequency and 7 equal parts according to amplitude, which makes a total of 168 standard sinusoidal signals. The ADC 1 converts the standard sinusoidal signals into digital signals with noise and distortion. The digital signal processor 2-2 generates standard digital signals without noise and distortion according to the frequency and amplitude information. The deep network 2-3 takes digital signals with noise and distortion and standard digital signals as inputs, and uses gradient descent method (a kind of optimization algorithm) to perform training (i.e., reconfiguration) on convolution parameters of the four-layer convolution layer. After 500,000 iterative calculations training, the difference between the digital signal with noise and distortion and standard digital signal is minimized. After the above process, the trained deep network 2-3 has the computing power to perform noise suppression and distortion correction.

(2) Application Phase:

Sampled analog signals are input through the first input port of the ADC 1. The first output port of the ADC 1 is connected to the first input port of the deep network 2-3. Digital signals after process of noise suppression and distortion correction are obtained at the first output port of the deep network 2-3.

The ADC 1 converts sampled analog signals into digital signals with noise and distortion. The deep network 2-3 trained in the previous phase performs calculations on digital signals with noise and distortion to recover digital signals after the process of noise suppression and distortion correction in the application phase.

Figure 2A:
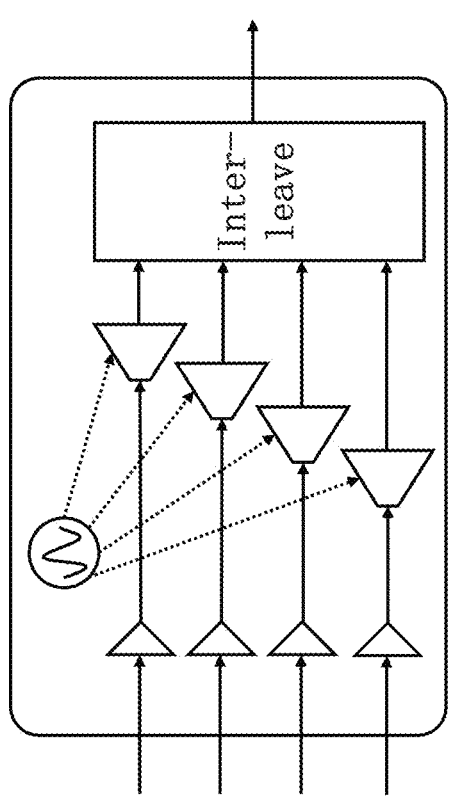
FIG. 2A is a schematic diagram of a multi-channel electronic ADC to be used in connection with the present invention.
Figure 2B:
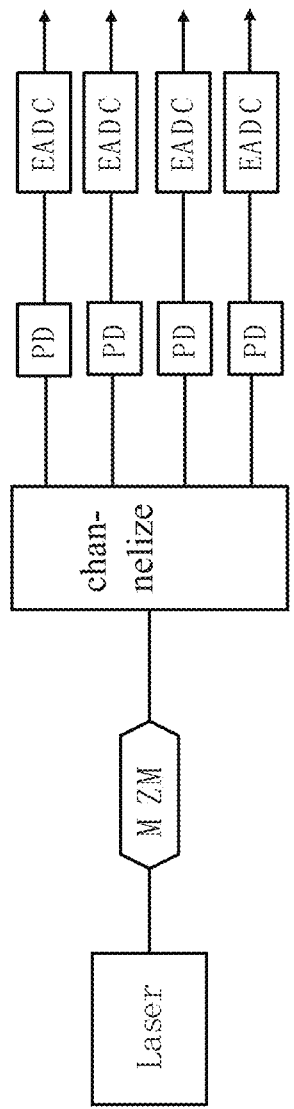
FIG. 2B is a schematic diagram of a multi-channel photon ADC to be used in connection with the present invention.

The ADC in the present invention is an electronic ADC or a photonic ADC. As depicted in FIG. 2A, a multi-channel electronic ADC may be used, and the electronic ADC may be a data acquisition board or an oscilloscope. As depicted in FIG. 2B, a multi-channel photon ADC may be used.

Figure 3:
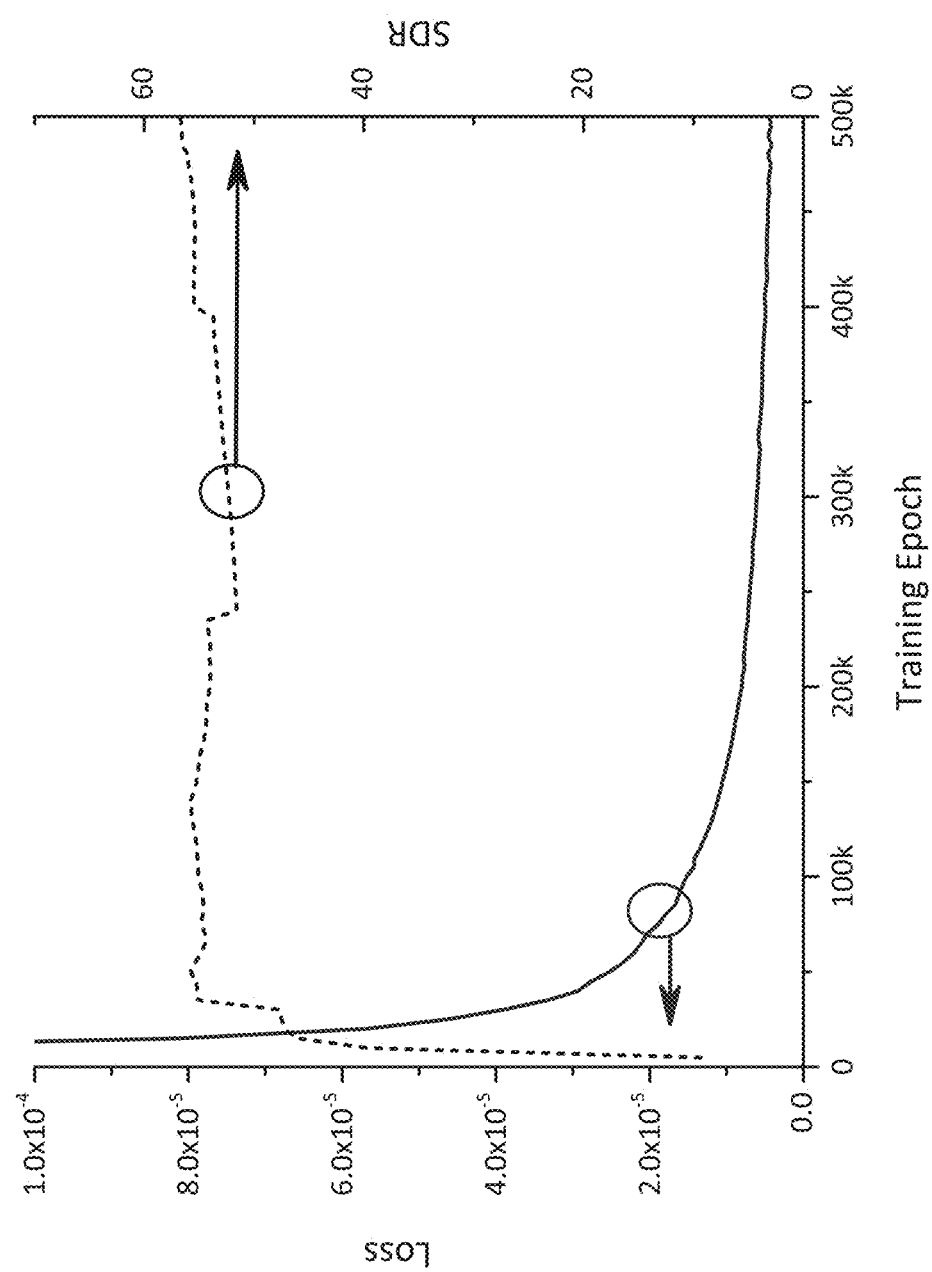
FIG. 3 is a graph showing the relationships between noise suppression and distortion correction capability of the deep network and the training time.
Figure 4A:
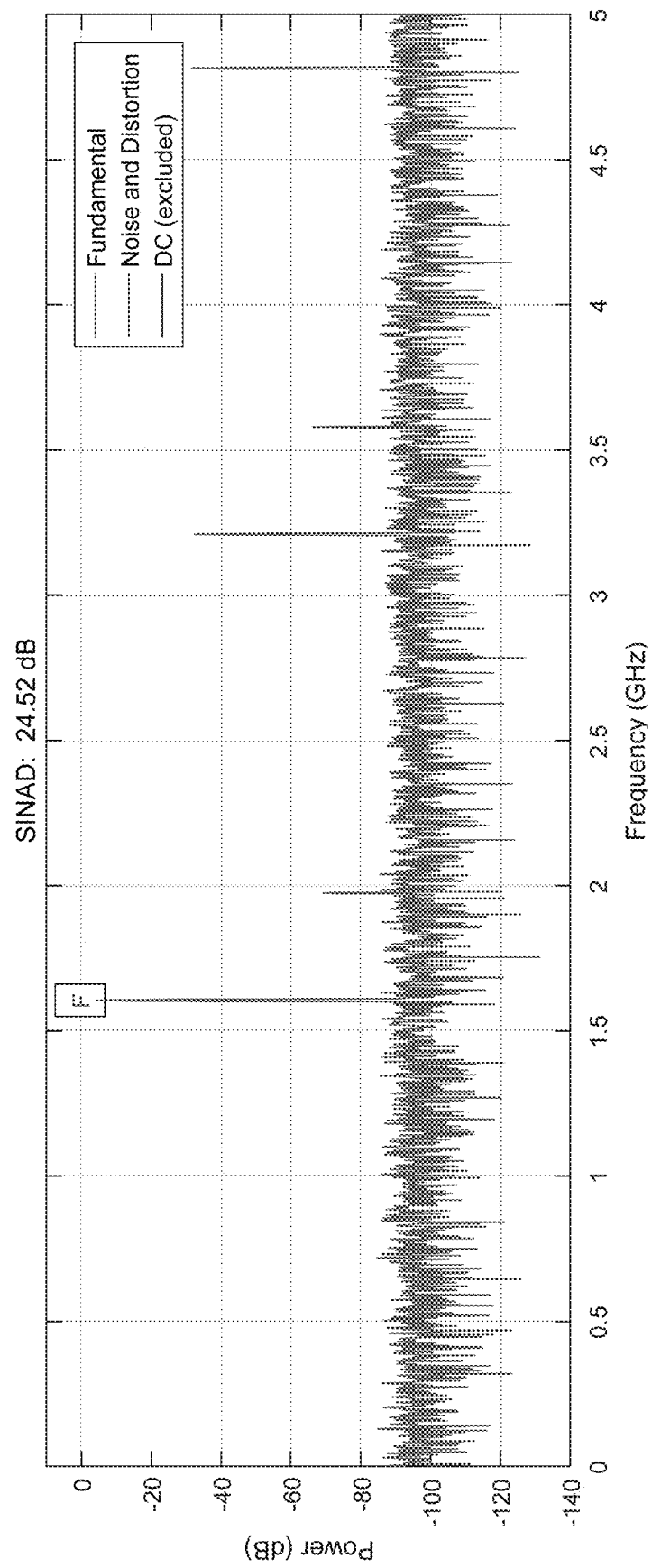
FIG. 4A is a spectrum diagram of the nonlinear response signal passes through the ADC.
Figure 4B:
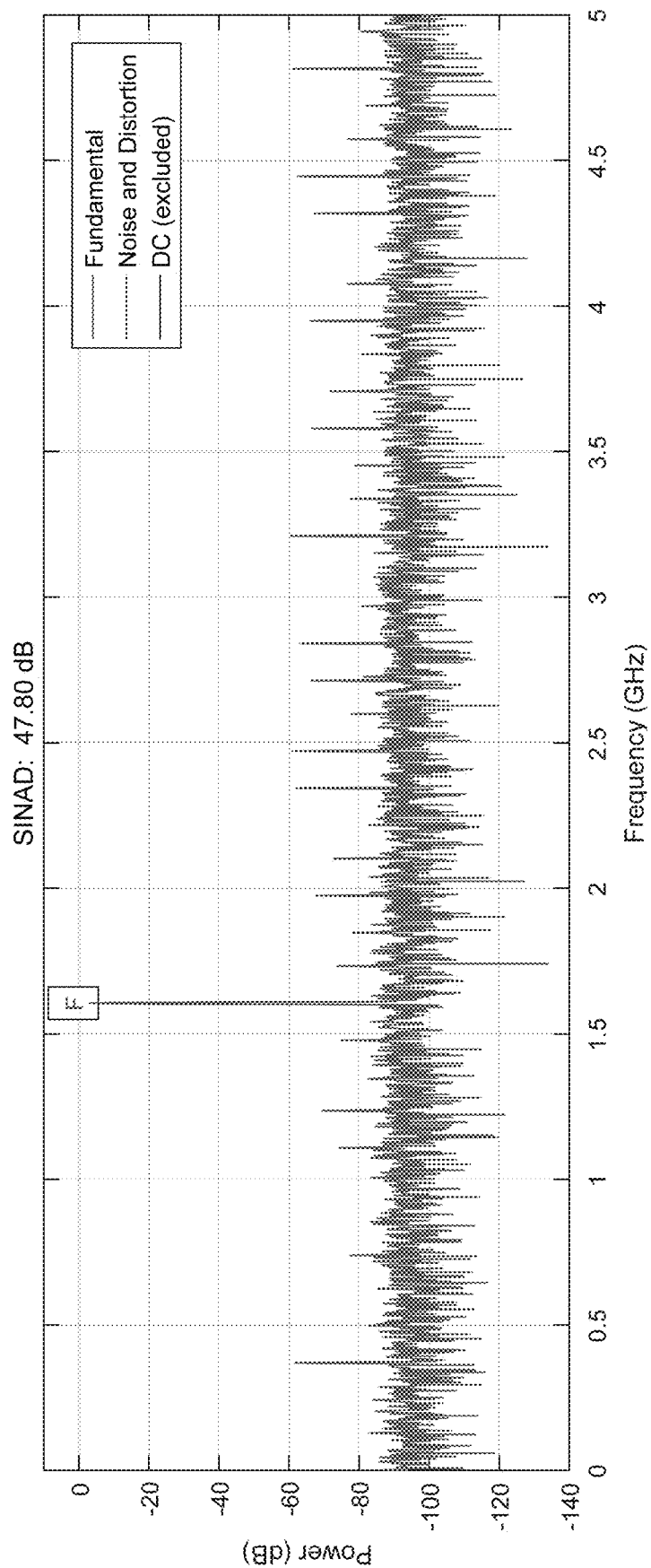
FIG. 4B is a spectrum diagram of the nonlinear distortion correction signal obtained after the nonlinear response signal passes through the deep network, both of which show the calibration result of the nonlinear distortion.

In the above process, in the training phase, multiple known signals pass through the single channel photonic ADC and nonlinear distortion outputs obtained. The deep network is trained to learn nonlinear distortion response of the single-channel photonic ADC and thereby achieves nonlinear correction of the single-channel photonic ADC in the application phase. The effect is shown in FIGS. 3, 4A, and 4B. FIG. 3 describes relationships between noise suppression and distortion correction capability of the deep network and the training time. As the number of training increases, the absolute value of the difference between the signal obtained after calculation by the deep network and standard signal gradually becomes smaller, and the signal-to-noise ratio of the obtained signal increases. FIGS. 4A and 4B show calibration result of nonlinear distortion, where FIG. 4A is a nonlinear response signal which passes through the single-channel photonic ADC, and FIG. 4B is a nonlinear distortion correction signal obtained after the nonlinear response signal passes through the deep network. It can be seen that after correction by the deep network, the harmonics caused by the nonlinear response are greatly eliminated.

We claim:

1. A device for noise suppression and distortion correction of analog-to-digital converters (ADC) based on deep learning, comprising
    an ADC having an input port and an output port, and
    a deep learning information processing module, the deep learning information processing module comprising
        a microwave signal source having a first output port and a second output port,
        a digital signal processor having an input port and a first output port, and
        a deep network having a first input port and a second input port,
    wherein the first output port of the microwave signal source is connected to the input port of the ADC;
    the second output port of the microwave signal source is connected to the input port of the digital signal processor;
    the output port of the ADC is connected to the first input port of the deep network; and
    the first output port of the digital signal processor is connected to the second input port of the deep network.

2. The device for noise suppression and distortion correction of analog-to-digital converters based on deep learning of claim 1, wherein the ADC is an electronic ADC or a photonic ADC, and the electronic ADC is a data acquisition board or an oscilloscope.

3. The device for noise suppression and distortion correction of analog-to-digital converters based on deep learning of claim 1, wherein the microwave signal source is a phase locked frequency-multiplied source, a voltage controlled oscillator, or an electro-optical oscillation source.

4. The device for noise suppression and distortion correction of analog-to-digital converters based on deep learning of claim 1, wherein the digital signal processor is a field programming gate array (FPGA) or a digital signal processor (DSP).

5. The device for noise suppression and distortion correction of analog-to-digital converters based on deep learning of claim 1, wherein the deep network is a convolution neural network or a recurrent neural network, which can be constructed in a central processing unit (CPU), a graphic processing unit (GPU), a tensor processing unit (TPU), or a photonic neural network.

* * * * *